United States Patent [19]

Fujita

[11] Patent Number: 5,363,339
[45] Date of Patent: Nov. 8, 1994

[54] SEMICONDUCTOR MEMORY DEVICE

[75] Inventor: Mamoru Fujita, Tokyo, Japan

[73] Assignee: NEC Corporation, Tokyo, Japan

[21] Appl. No.: 159,560

[22] Filed: Dec. 1, 1993

[30] Foreign Application Priority Data

Dec. 1, 1992 [JP] Japan .................................. 4-321745

[51] Int. Cl.5 .......................................... G11C 11/407
[52] U.S. Cl. .................................. 365/230.06; 365/51; 365/63
[58] Field of Search ...................... 365/51, 63, 230.06, 365/230.03

[56] References Cited

U.S. PATENT DOCUMENTS 4,635,233  1/1987  Matsumoto et al. ........... 365/230.06
4,636,982  1/1987  Takemae et al. ................ 365/230.06

Primary Examiner—Joseph A. Popek
Attorney, Agent, or Firm—Sughrue, Mion, Zinn, Macpeak & Seas

[57] ABSTRACT

A semiconductor memory device, wherein memory cell arrays MA11, 12, 13, ... are arranged in a matrix. First driving circuits Da11, 12, 13, ... and second driving circuits Db11, 12, 13, ... are arranged alternately at the intersections of the word driver WD11, 12, 13, ... columns and the sensing circuit SC11, 12, 13 ... rows. The first driving circuits Da11, 12, 13, ... serve to drive the sense amplifiers SA11, 12, 13, ... of the sensing circuits SC11, 12, 13, ..., and the second driving circuits Db11, 12, 13, ... to drive the precharge circuits PC11, 12, 13, ... and transfer circuits TG11, 12, 13, ... so that a sensing circuit SC11, 12, 13, ... is driven by the first and second driving circuits Da11, 12, 13, ... and Db11, 12, 13, ... on opposite sides of it.

3 Claims, 5 Drawing Sheets

SEMICONDUCTOR MEMORY DEVICE

BACKGROUND OF THE INVENTION

2 Field of the Invention

This invention relates to a semiconductor memory, and more particularly to a dynamic-RAM (DRAM) comprising an arrangement of a plurality of memory cell arrays with driving circuits for sense amplifiers, etc.

2. Description of the Prior Art

In recent years, semiconductor memory capacities have increased, and as a result it has been common to arrange memory cell arrays into matrix form. It is usually necessary to provide a word driver and sensing circuitry for each memory cell array. There is additionally provided a driving circuit for driving each row of sensing circuits.

As memory capacity increases, the needed number of sensing circuits driven by driving circuits also increases, along with an extension of the signal lines. As the length of the signal line increases, the parasitic capacitance and resistance also increase, and therefore the signal transfer times to different sensing circuits can become considerably different.

One suggested solution to this problem has been to provide additional driving circuit spaced between the sensing circuits. Due to the complexity of the driving circuit, a complete driving circuit will not fit between sensing circuits without expanding the size of the entire matrix. This solution, therefore, greatly increases the size of the matrix and is often not practical.

BRIEF SUMMARY OF THE INVENTION

Object of the Invention

It is an object of the present invention is to provide a semiconductor memory permitting increased speed of operation by effective utilization of space, maintaining the overall area substantially as it is.

Summary of the Invention:

A semiconductor memory according to the present invention comprises a plurality of memory cell arrays arranged in a matrix form. Each memory cell array consists of a plurality of memory cells arranged in rows and in columns, a plurality of word lines for activating the memory cells in a row as a unit, and a plurality of bit lines for transferring the data of the memory cells in a column as a unit. Word drivers are arranged in the memory cell array rows between the memory cell arrays, for driving any specified word line of the adjacent memory cell array to a select level in response to an address signal. Sensing circuits are arranged in the memory cell array columns between the memory cell arrays. Each sensing circuit includes a precharge circuit, which precharges the bit lines of the adjacent memory cell array under a specified timing, a transfer circuit for controlling connections between the precharge circuit and bit lines, and a sense amplifier for amplifying signals on the bit lines. First and second driving circuits are arranged alternately in the sensing circuitry rows in order to interpose a sensing circuit between each set of first and second driving circuits. Each sensing circuit is separated into first and second circuit parts. Each first driving circuit activates the first circuit part or parts of the adjacent sensing circuit or circuits, and each second driving circuit activates the second circuit part or parts of the adjacent sensing circuit or circuits.

BRIEF DESCRIPTION

The above mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
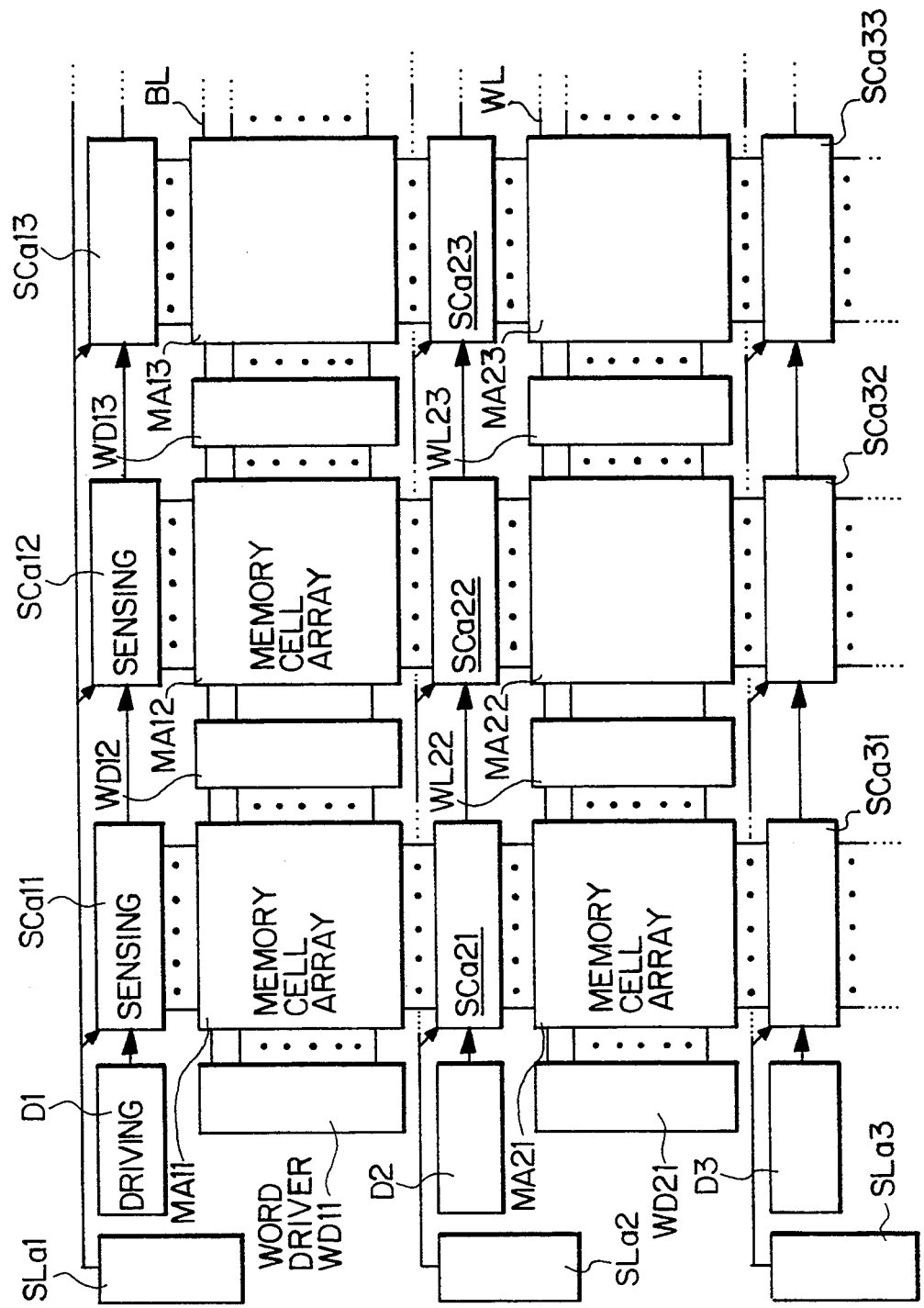
FIG. 1 is a block diagram of a semiconductor memory in the prior art.

Referring to FIG. 1, the problem to be solved by the present invention will be set forth in detail. Recently, large memory capacities have dictated the division of memory into memory cell array arrangements. As shown in FIG. 1, a plurality of memory cell arrays MA11 to MA23 are arranged in a matrix form. Each memory cell array consists of a plurality of memory cells arranged in rows and columns, a plurality of word lines WL which, when at the select level, activate the memory cells in each row as a unit, and a plurality of bit lines BL which transfer the data of the memory cells in each column as a unit when held selected. Word drivers WD11 to WD23 are arranged in the memory cell arrays MA11 to MA23, and drive the specified word lines of the respective adjacent memory cell arrays to the select level. Sensing circuits SCA11 to SCA33 are arranged in the memory cell arrays MA11 to MA23. Each of them consists of a precharge circuit for precharging the bit lines of the adjacent memory cell array under a specified timing, a transistor circuit for performing transfer control between the precharge circuit and the bit lines, and a sense amplifier for amplifying signals on the bit lines. There are additionally provided driving circuits D1 to D3 arranged in a row at one end of the sensing circuitry column, for activating the sensing circuits.

Distances from driving circuits to their respective sensing circuits differ; for example, the distance from D1 to SCa13 is longer than from D1 to SCa11. This poses a problem of creating different signal transfer times to different sensing circuits.

Figure 2:
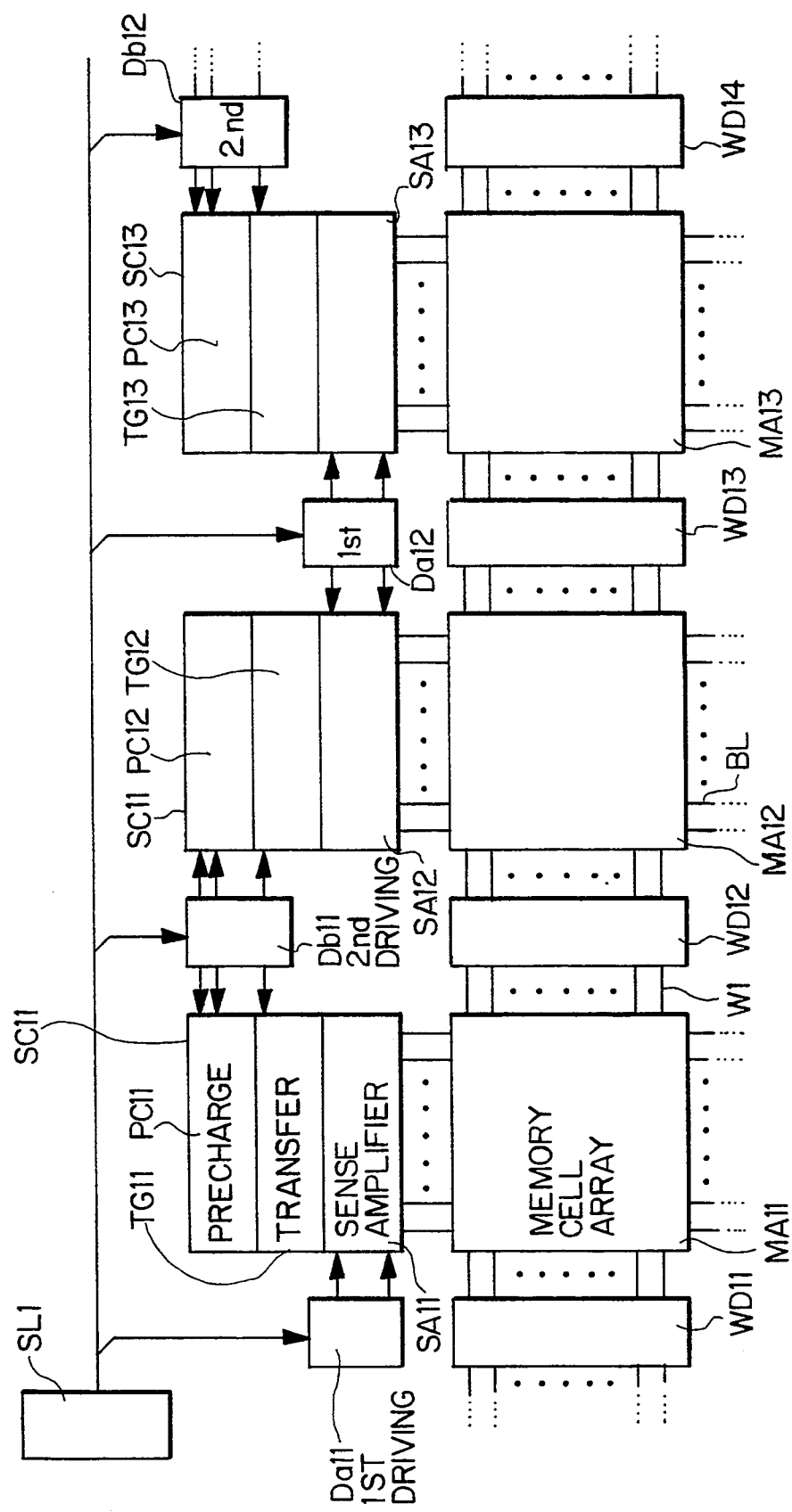
FIG. 2 is a block diagram of an embodiment of the present invention.

As shown in FIG. 2, the present invention is distinguished from the prior art semiconductor memory diagrammed in FIG. 1 in that each sensing circuit (SC11 to SC13) is separated into a first circuit part including a sense amplifier SA11, 12, 13, . . . and a second circuit part including a precharge circuit PC11, 12, 13, . . . and a transfer circuit TG11, 12, 13, . . . . The driving circuits are divided into first driving circuits Da11, Da12, . . . for activating the first circuit part, and second driving circuits Db11, Db12, . . . for activating the second circuit part. The first and second driving circuits Da and Db are arranged alternately in the sensing circuit rows to interpose a sensing circuit between each set of first and second driving circuits.

A select circuit SL1 controls the state (enable or disable) of all driving circuits connected to it. For example, when select circuit SL1 becomes activated, the first driving circuit Da12 simultaneously drives sense amplifiers SA12 and SA13 located on opposite sides. Similarly, the second driving circuit Db11 simultaneously drives precharge circuits PC11, PC12 and transfer circuits TG11, TG12 located on opposite sides.

This construction permits, for example, the placement of any first driving circuit (for the adjacent sense amplifiers) alone within the space between the word line driver and the sensing circuits, without needing additional area. Thus no significant difference arises between transfer times to driving circuits.

Figure 3:
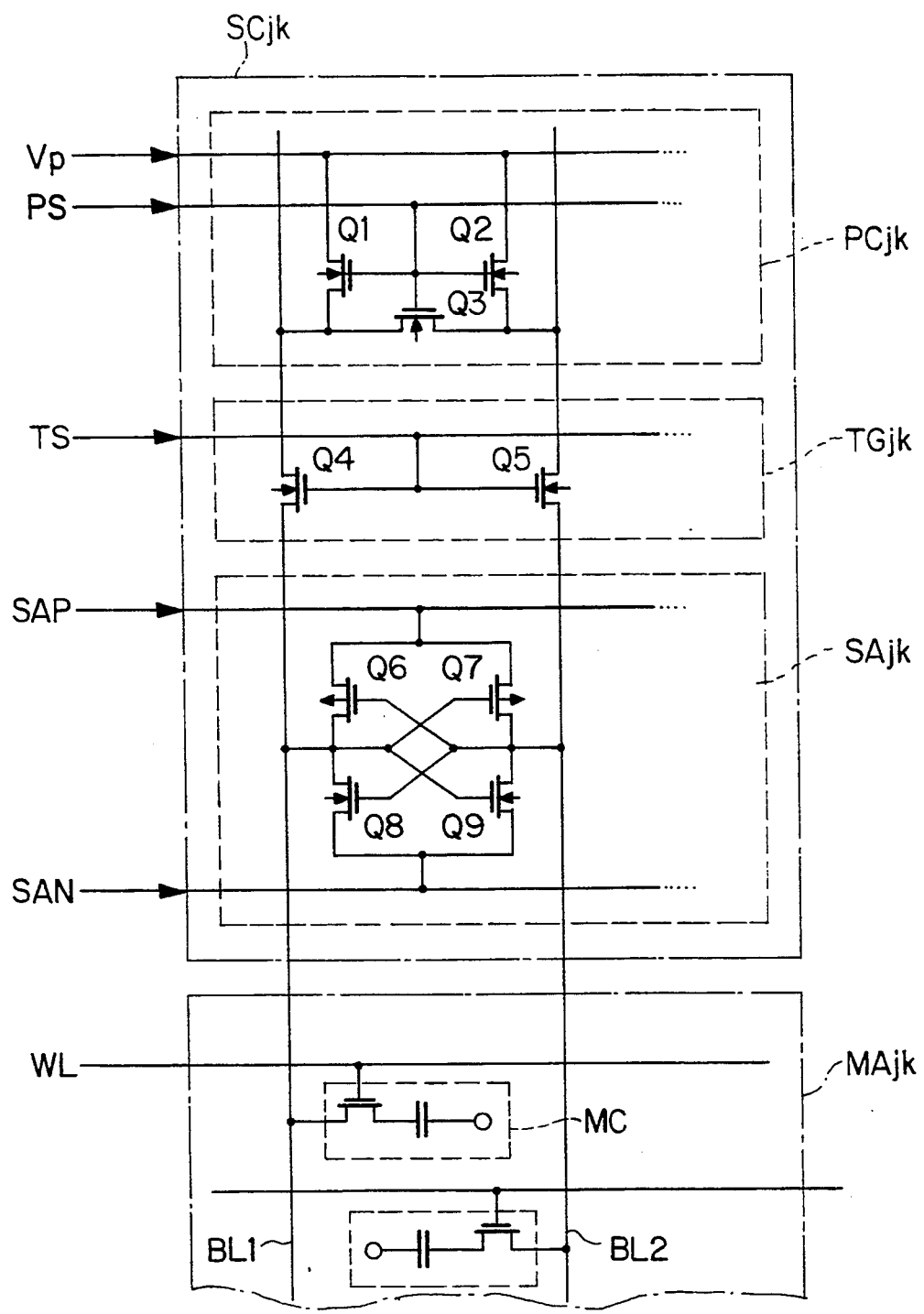
FIG. 3 is a circuit diagram of respective examples of a precharge circuit, a transfer circuit, and a sense amplifier.
Figure 4:
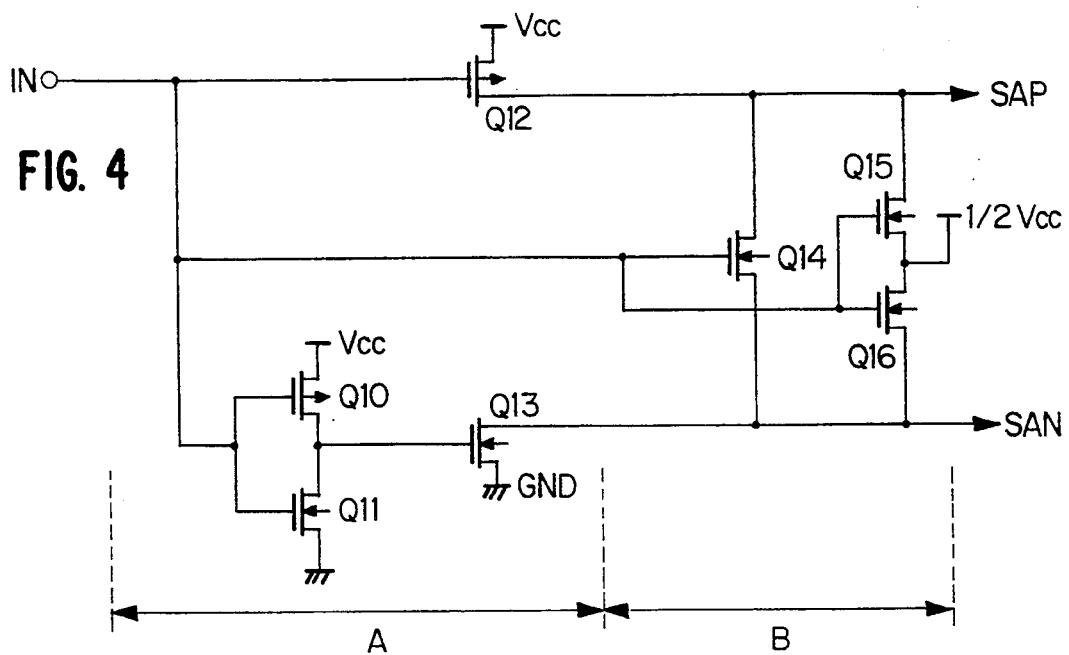
FIG. 4 is a circuit diagram of an example of a driving circuit for a sense amplifier.

Referring to FIGS. 3–6, the reason for needing no extra area will be explained. As shown in FIG. 3, each sensing circuit SCjk consists of a precharge circuit PCjk, a transfer circuit TGjk, and a sense amplifier SAjk, which are driven by drive signals PS, TS, and SAP/SAN, respectively. The driving circuit for the sense amplifier is shown in FIG. 4, which is divided into a drive section A and a reset section B. The driving circuit Da12 must supply drive signals to sense amplifiers SA12 and SA13 on opposite sides and therefore have a corresponding double drive capability.

Figure 5:
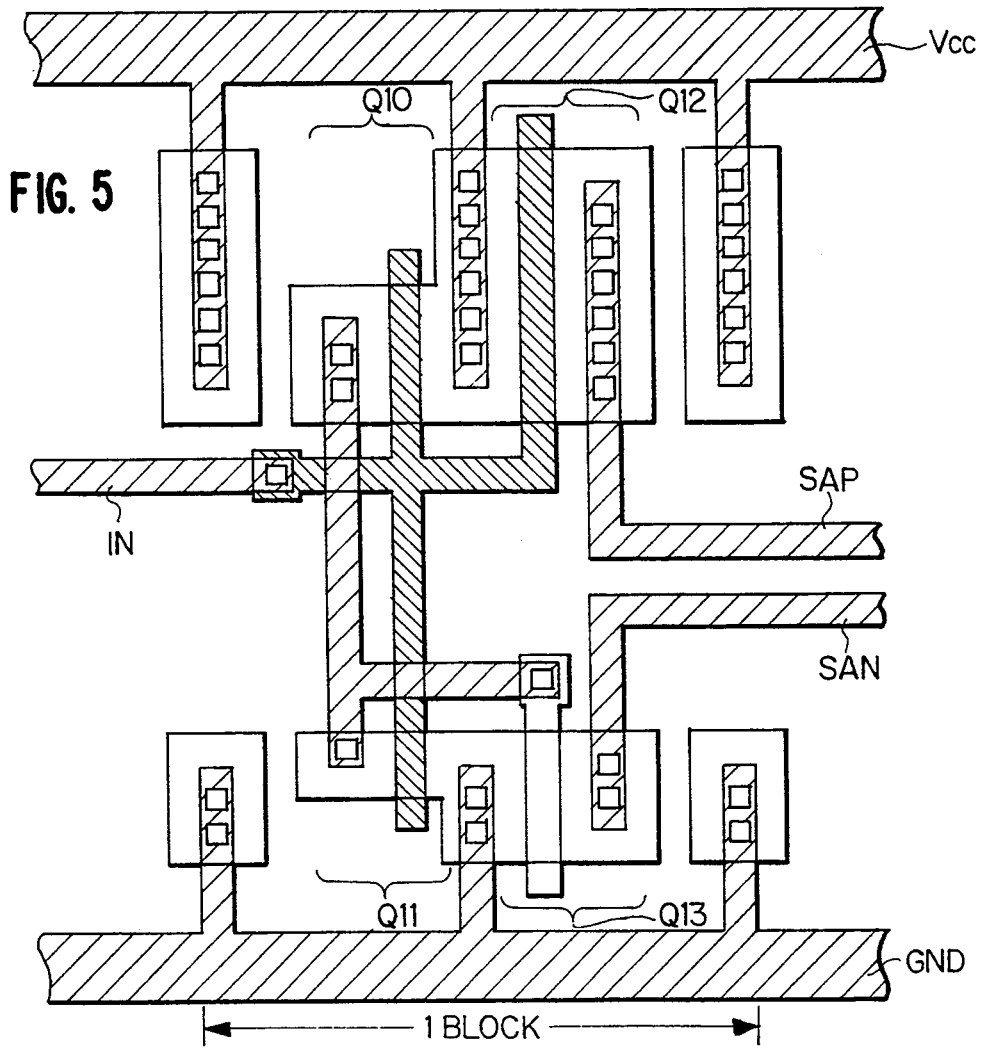
FIG. 5 is a partial planar layout of a driving circuit.

FIG. 5 shows the planar layout of the drive section A in FIG. 4. The drive capability of the drive section A having the pattern shown, can be improved by widening the gate width.

Figure 6:
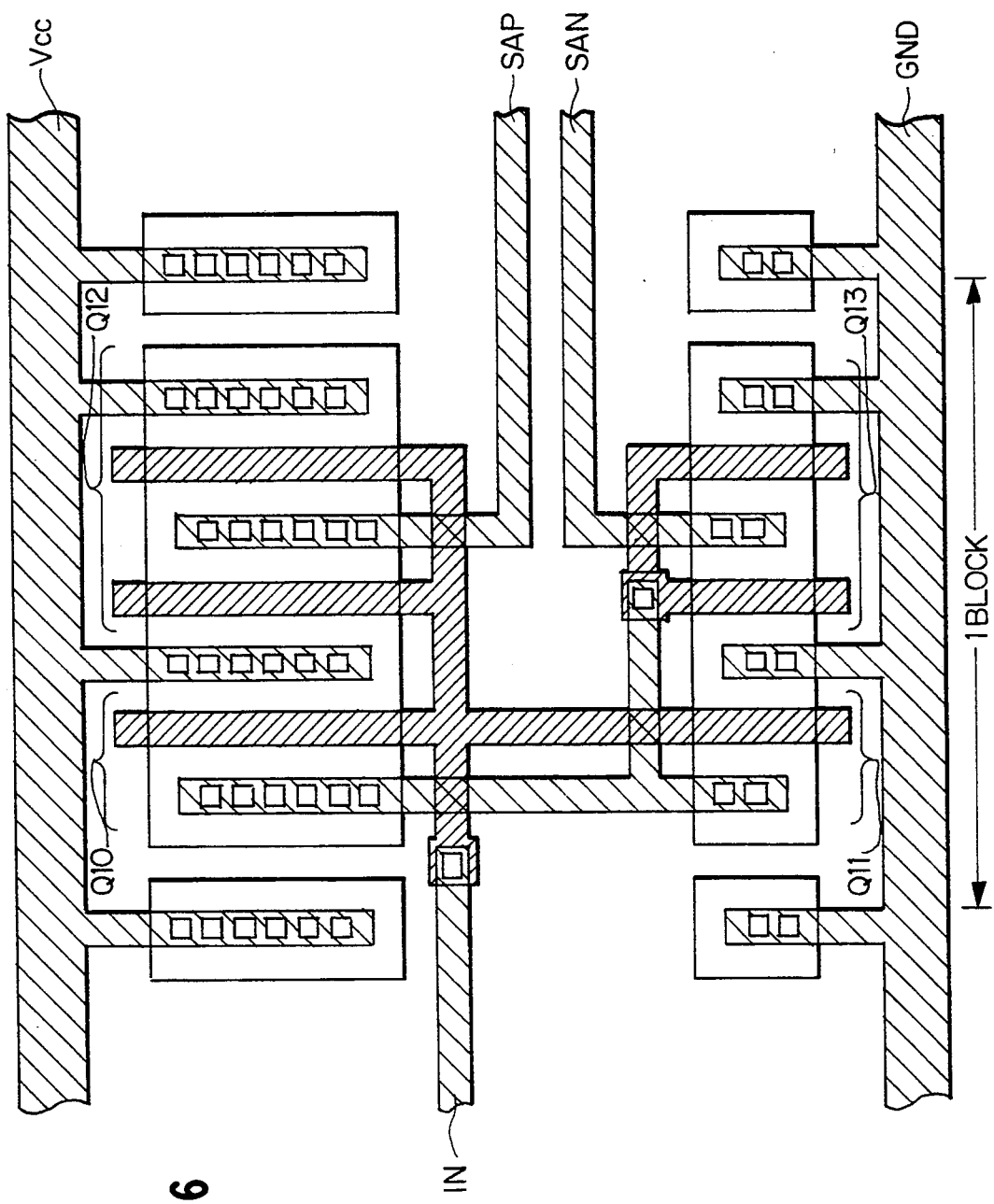
FIG. 6 is a partial planar layout of an alternative driving circuit having a greater drive capability than the circuit of FIG. 5.

As shown in FIG. 6, the folded p- and n-channel transistors Q12, and Q13 have doubled gate electrodes for widening their channel widths. This technique can double the gate width or the drive capability without needing significant additional circuit area.

By dividing the drive circuitry into subcircuits, and increasing their drive capability without a considerable size increase, more flexible drive circuit placement is possible. Therefore, larger matrices of memory cell arrays can be effectively controlled.

What is claimed is:

1. A semiconductor memory device comprising: a plurality of memory cell arrays arranged in a matrix form, wherein said memory cell arrays are interconnected via rows of word lines and columns of bit lines;
   a plurality of word drivers arranged in the rows of said matrix, parallel to the word lines and alternately with said memory cell arrays, each word driver driving any specified word line of the adjacent memory cell array to a select level,
   a plurality of sensing circuits arranged in the memory cell array columns parallel to the bit lines and alternately with said memory cell arrays, each sensing circuit consisting of a precharge circuit, a transfer circuit and a sense amplifier; and
   first and second driving circuits arranged alternately in the sensing circuit rows parallel to said word lines in order to interpose a sensing circuit between the first and second driving circuits adjacent each other, each sensing circuit being separated into first and second circuit parts, each first driving circuit driving said first circuit parts of the adjacent sensing circuits, and each second driving circuit driving said second circuit parts of the adjacent sensing circuits.

2. A semiconductor memory claimed in claim 1 further comprising common selectors each for activating said first and second driving circuits.

3. A semiconductor memory comprising a plurality of memory cell arrays arranged in a matrix form, each consisting of a plurality of memory cells arranged in rows and columns, a plurality of word lines for activating said memory cells in a row as a unit, and a plurality of bit lines for transferring the data of the memory cells in a column as a unit;
   a plurality of word drivers arranged in the memory cell array rows and alternately with said memory cell arrays, each word driver for driving any specified word line of the adjacent memory cell array to a select level in response to a first address signal,
   a plurality of sensing circuits arranged in the memory cell array columns and alternately with said memory cell arrays, each sensing circuit including a precharge circuit, for precharging the bit lines of the adjacent memory cell array, a transfer circuit for controlling connections between said precharge circuit and said bit lines, and a sense amplifier for amplifying signals on said bit lines; and
   first and second driving circuits arranged alternately in the sensing circuit rows parallel to said word lines interposing a sensing circuit between said first and second driving circuits adjacent each other, each sensing circuit being separated into first and second circuit parts, each first driving circuit for activating said first circuit parts of the adjacent sensing circuits and each second driving circuit for activating said second circuit parts of the adjacent sensing circuits.

* * * * *